United States Patent [19]
Kageyama et al.

[11] Patent Number: 6,037,270
[45] Date of Patent: Mar. 14, 2000

[54] METHOD OF MANUFACTURING SEMICONDUCTOR DEVICE AND METHODS OF PROCESSING, ANALYZING AND MANUFACTURING ITS SUBSTRATE

[75] Inventors: Mokuji Kageyama; Moriya Miyashita, both of Yokohama, Japan

[73] Assignee: Kabushiki Kaisha Toshiba, Kawasaki, Japan

[21] Appl. No.: 08/496,677

[22] Filed: Jun. 29, 1995

[30]     Foreign Application Priority Data

Jun. 30, 1994  [JP]  Japan ................................. 6-171648

[51] Int. Cl.⁷ .............................. C23F 1/24; C23F 1/10
[52] U.S. Cl. .................... 438/746; 438/704; 438/706; 438/708; 438/689; 438/753; 216/89; 216/87; 216/94; 216/99; 216/108; 216/109
[58] Field of Search .................... 438/746, 704, 438/706, 708, 689, 753; 216/89, 87, 94, 99, 108, 109

[56]           References Cited

U.S. PATENT DOCUMENTS

| 5,051,134 | 9/1991 | Schnegg ........................................ 134/3 |
| 5,234,540 | 8/1993 | Grant et al. . | |
| 5,238,529 | 8/1993 | Douglas ..................................... 156/635 |
| 5,271,796 | 12/1993 | Miyashita et al. . | |
| 5,464,480 | 11/1995 | Matthews ................................. 134/1.3 |

FOREIGN PATENT DOCUMENTS

| 0 438 727 | 7/1991 | European Pat. Off. . |
| 0 468 213 | 1/1992 | European Pat. Off. . |
| 60-57937 | 4/1985 | Japan . |
| 61-4576 | 1/1986 | Japan . |
| 4-15614 | 3/1992 | Japan . |
| 6-204200 | 7/1994 | Japan . |

OTHER PUBLICATIONS

Patent Abstracts of Japan, vol. 16, No. 558 (E–1294) [5601], Nov. 27, 1992, JP–A–4 213 819, Aug. 4, 1992.
J. Electrochemical Society, vol. 138, No. 9, pp. 2799–2802, Sep. 1991, M.A. Douglas, et al., "Photostimulated Removal of Trace Metals".

*Primary Examiner*—Donna Wortman
*Assistant Examiner*—Mary K Zeman
*Attorney, Agent, or Firm*—Oblon, Spivak, McClelland, Maier & Neustadt, P.C.

[57]                ABSTRACT

The gate oxide film is prevented from being thinned partially. The semiconductor substrate (wafer) can be etched (processed) under excellent conditions. The impurities on the wafer surface can be analyzed and further reduced. In the first aspect, the substrate is irradiated with ultraviolet rays in contact with an F-containing aqueous solution, so that the oxide film and the substrate can be etched at roughly the same etching speed under excellent controllability without deteriorating the planarization of the substrate. In the second aspect, the substrate is etched by irradiating ultraviolet rays during exposure to an acid aqueous solution, so that surface metallic contamination and particles can be removed without deteriorating the wafer surface roughness. Further, the impurity elements in the outermost surface layer of the wafer can be analyzed at high precision by analyzing elements contained in the acid aqueous solution used for the etching. According to the third aspect, holes and electrons are recombined in the polycrystal silicon during irradiation of the ultraviolet rays, and metallic impurities are dissolved into the aqueous solution as ions, so that metallic impurities in the polycrystal silicon can be reduced.

23 Claims, 15 Drawing Sheets

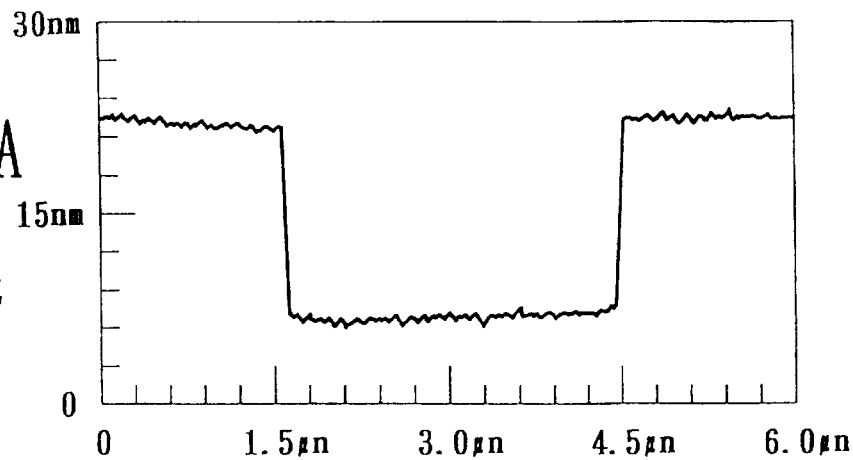
FIG. 15A LEFT TRACE
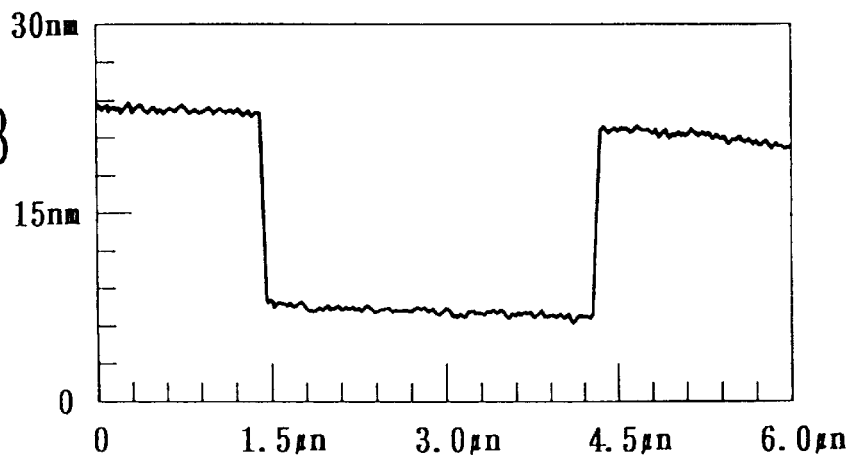
FIG. 15B RIGHT TRACE

METHOD OF MANUFACTURING SEMICONDUCTOR DEVICE AND METHODS OF PROCESSING, ANALYZING AND MANUFACTURING ITS SUBSTRATE

FIELD OF THE INVENTION

The present invention relates to a method of manufacturing a semiconductor device, and methods of processing, analyzing and manufacturing a semiconductor substrate.

BACKGROUND OF THE INVENTION (First background art)

In manufacturing of a semiconductor device, in general, one of the important steps is micro-miniaturization processing. In this step, any desired characteristics of the semiconductor device can be obtained by electrically isolating elements from each other. For this purpose, conventionally, the device elements have been isolated electrically in accordance with a local substrate oxidizing method which is referred to as LOCOS (localized oxidation of silicon) method. In this LOCOS method, as shown in FIG. 4, a thick oxide film (field oxide film) 14 is formed locally on the basis of hydrogen combustion oxidation so that the elements can be isolated from each other electrically.

In more detail, as shown in FIG. 4(A), a pad oxide film 12 is formed on a Si substrate 11. Further, a nitride film 13 is formed at a part corresponding to a predetermined element forming region on the pad oxide film 12, as a mask against oxidation.

After that, as shown in FIG. 4(B), an oxide film 14 is formed locally on the basis of hydrogen combustion oxidation.

Successively, as shown in FIG. 4(C) the nitride film 13 and the thin oxide film (pad oxide film) 12 are etched at the middle portion thereof.

After that, as shown in FIG. 4(D), the whole substrate is oxidized again to form a field oxide film 14A and 14B between both the thick portions of the oxide film 14.

As understood by the above description, an element region can be formed being surrounded by the thick field oxide film 14. On the element regions thus formed, various MOS transistors and MOS capacitors are to be formed. With the advance of higher integration and microminiaturization of the devices, however, since the electric characteristics required for the devices have become severe more and more, various problems have arisen even in the LOCOS method. One of the problems is so-called bird's beak. Here, the bird's beak implies the bird's beak-like oxide film portion 12A extending so as to be opposed to each other on the element region, when seen in the cross section, as shown in FIG. (B). This bird's beak is formed, because oxygen infiltrates to under the nitride film 13 used as an oxidation mask when the field oxide film is selectively oxidized in accordance with the LOCOS method. Therefore, before forming the gate oxide film 14A, the bird's beak (the relatively thin oxide film 12A formed on the element region) must be etched off perfectly. In this pre-etching process, therefore, a sufficient etching processing time is determined in view of a margin in order to remove the oxide film 12A perfectly. In this case, however, since the field oxide film 14 is inevitably etched off slightly as shown in FIG. 4(C), corners 11A are produced at each end portion of the element region, with the result that the planarization of the element region deteriorates. Consequently, when the gate oxide film 14A is formed under these conditions, since the oxidization speed is slower at the corner portions than the oxidization speed at the other portions, the oxide film 14 is thinned locally (referred to as thinning), so that the thin portion 14B is formed. As a result, there exists a problem in that the oxide film is easily broken down starting from this thinned gate oxide film 14A.

(Second background art)

A number of methods of processing a semiconductor wafer by use of ultraviolet rays have been so far proposed. These methods are mainly of ozone oxidation method such that ozone or active oxygen is formed from oxygen in water or air by use of ultraviolet rays to remove organic substances from the surface of the semiconductor wafer by a strong oxidization performance of the formed ozone.

As the method of using ultraviolet rays other than ozone oxidation method, dry washing method has been so far known such as radicalization of various reactive gases. In the case of wet washing, on the other hand, only abstract expression has been so far made of the removal of inorganic substances, in addition to the above-mentioned ozone oxidation.

Further, the important parameters are metal contamination and particles adhering on the surface of the wafer from the standpoints of semiconductor wafer washing. In the ordinary process, since the semiconductor wafer is not largely contaminated from the outside, the removal of organic substances are limited to only the removal of resist. As a result, the wet washing has been often adopted. In the case of alkaline washing, since the surface of the semiconductor wafer can be etched, it is possible to remove particles effectively. In this method, however, there exist some problems in that it is difficult to prevent metal from being absorbed by the wafer surface or the wafer surface roughness from being deteriorated. In contrast with this, in the case of acid washing, although metal contamination can be removed effectively, since the surface of the semiconductor wafer cannot be etched, particles cannot be removed effectively. As a result, conventionally, the alkaline and acid washing have been often used in combination. However, this washing method is not an optimum washing method.

On the other hand, as the metal impurity analysis techniques of the semiconductor wafer, various high sensitivity methods have been so far developed in both surface analysis and bulk analysis. In the case of the surface analysis, for instance, TRXRF (total reflection X-ray fluorescent spectroscopy) or VPD (vapor phase decomposition method) and/or AAS (atomic absorption spectroscopy) (e.g., vapor phase cracking atomic absorption spectroscopy) are in particular effective as the high sensitivity analysis. Further, in the case of the bulk analysis, there have been adopted such methods that: the surface layer of a semiconductor substrate is etched by use of a mixture liquid (hydrofluoric and nitric acid) of hydrofluoric acid and nitric acid, and further the heated and concentrated etching liquid is analyzed in accordance with the AAS method or such that: a piece of the semiconductor wafer is dissolved by a full hydrofluoric and nitric acid solution and the dissolved wafer is analyzed in accordance with AAS (flame-less atomic absorption spectroscopy) of ICP (induction coupled plasma) and/or MS (mass spectroscopy) (i.e., induction coupled plasma mass spectroscopy).

In practice, however, the distribution of metallic impurities in the semiconductor wafer largely differs according to the thermal process immediately before the analysis. In addition, in many cases, there exists such a tendency that the metallic impurities exist the most in the outermost surface thereof and decrease gradually in the direction toward bulk center. According to circumstances, metallic impurities are trapped and deposited at the crystal defects localized near the bulk center, so that the distribution of metallic impurities differs largely in the depth direction. In other words, in order to know the distribution of the metallic impurities of the semiconductor wafer, it is important to analyze the etchent used for etching the semiconductor surface. On the other hand, in general, since the semiconductor wafer is etched by use of hydrofluoric nitric acid based etchent, a relatively high concentration acid is required to analyze the surface of the semiconductor wafer. Further, since the reactivity of the etchent is high, the reaction starts immediately after the contact of the etchent with the semiconductor wafer. As a result, the etching is not effected smoothly, and in addition a high purity chemicals is essentially required. In particular, where the outermost layer of about 10 nm is required to be analyzed, the analyzed value is largely subjected to the influences of the impurity of the chemical and the uniformity of the etching.

(Third background art)

The monocrystal wafer used for the MOS type semiconductor substrate is formed by first melting polycrystal silicon within a quartz crucible, by manufacturing an monocrystal ingot in accordance with a pulling method referred to as CZ (Czochralski) method, and further by cutting the ingot into a wafer. The polycrystal silicon used as raw material is formed by reducing quartzite into solid silicon and by further refining the solid silicon through several stages. The formed polycrystal silicon is melted in a quartz crucible as raw material for pulling a monocrystal silicon. Before being placed in the quartz crucible, the surface of the polycrystal silicon is etched about 1 to 5 $\mu$m by a mixture liquid of acid and nitric acid in order to remove impurities from the surface of the polycrystal silicon.

The purity of the polycrystal silicon used for the prior art technique is very high. In general, however, the silicon wafer formed by use of the high-purity polycrystal silicon includes metallic impurities enough to deteriorates the device characteristics. As a result of analysis of the liquid obtained by dissolving the silicon wafer by a mixture liquid of acid and nitric acid in accordance with the flame-less atomic spectroscopy, it was known that there exist Fe of $10^{10}$ atoms/cm$^3$ and Al of $10^{11}$ atoms/cm$^3$. As already explained, although the impurities on the surface of the polycrystal silicon can be removed, the metallic impurities contained in the polycrystal silicon can not be removed in practice.

As described above, in the prior art method, since there exists a thin portion in the gate oxide film, there exists a problem in that the gate oxide film is easily broken down beginning from this thin portion thereof. In addition, there exist other problems in that it is difficult to wash the semiconductor wafer easily and further analyze the metallic impurities of the semiconductor wafer. Further, although the impurities on the surface of the polycrystal silicon can be removed, there exists a problem in that it is difficult to remove the metallic impurities in the polycrystal silicon.

SUMMARY OF THE INVENTION

With these problems in mind, therefore, it is the object of the present invention to prevent the film thickness of the gate oxide film (formed after the field oxide film has been formed) from being reduced in the semiconductor substrate (wafer); to process (etch) the semiconductor substrate and further to analyze the impurities adhering onto the surface of the semiconductor substrate, while preventing the surface thereof from being contaminated by metal and further the surface roughness thereof from being degraded; and to reduce the metallic impurities within the wafer, To achieve the above-mentioned objects, the first aspect of the present invention provides a method of manufacturing a semiconductor device, comprising: a first step of forming a pair of field oxide film areas (14) and an intermediate oxide film area (12) sandwiched between the two field oxide film areas to cover an element forming region on a surface of a semiconductor substrate (1); a second step of etching the field oxide film areas (14) and the intermediate oxide film area (12) by use of an aqueous solution (2) containing at least fluorine in contact with the surface of the semiconductor substrate (1) as an etchent under irradiation of ultraviolet rays thereupon, after the element forming region of the semiconductor substrate (11) formed under the intermediate oxide film (12) having been exposed due to the advance of etching for removing the intermediate oxide film (12), the field oxide film areas (14) and the element forming region of the semiconductor substrate (11) being etched at substantially the same etching speed to such an extent that a ridge line of a bird beak of the element forming region becomes roughly flush with a surface of the element forming region; and a third step of forming an oxide film on surfaces of the field oxide film areas (14) and a surface of the element forming region.

Further, one of the second aspect of the present invention provides a method of processing a semiconductor substrate, which comprises: a first step of exposing a semiconductor wafer in an acid aqueous solution; and a second step of irradiating ultraviolet rays upon the semiconductor wafer exposed in the acid aqueous solution, to etch the semiconductor wafer.

Further, the other of the second aspect of the present invention provides a method of analyzing a semiconductor substrate, which comprises: a first step of exposing a semiconductor wafer in an acid aqueous solution; a second step of irradiating ultraviolet rays upon the semiconductor wafer exposed in the acid aqueous solution, to etch the semiconductor wafer; and a third step of analyzing the acid aqueous solution obtained after the etching processing, to analyze metallic impurities existing on the outermost surface layer of the semiconductor wafer.

Further, another of the second aspect of the present invention provides a method of processing a semiconductor substrate, which comprises: a first step of carrying a wafer (51) into a chamber and then replacing gas in the chamber with argon gas; a second step of removing a natural oxide film formed on the wafer (51); and a third step of applying a hydrochloric acid aqueous solution on a surface of the wafer (51) and further irradiating ultraviolet rays thereupon for etching thereof.

Further, the other of the second aspect of the present invention provides a method of processing a semiconductor substrate, which comprises: a first step of carrying a wafer (51) into a chamber and then replacing gas in the chamber with argon gas; and a second step of applying a hydrogen fluoride aqueous solution on a surface of the wafer (51) under irradiation of ultraviolet rays for etching of the wafer (51).

Further, another of the second aspect of the present invention provides a method of analyzing a semiconductor substrate, comprising: a first step of inserting a semiconductor wafer (71) between two casings (72, 75); a second step of damping the wafer (71) with chemicals of an acid aqueous solution of non-oxidization; a third step of irradiating ultraviolet rays upon the wafer (71) damped with the chemicals; and a fourth step of heating and enriching the chemicals for analysis.

Further, the other of the second aspect of the present invention provides a method of processing a semiconductor substrate, which comprises: a first step of removing an oxide film formed on a surface of the semiconductor substrate (35) by an aqueous solution or gas containing fluorine; a second step of supplying pure water on a surface of the semiconductor substrate (35); and a third step of irradiating ultraviolet rays upon the surface of the semiconductor substrate (35) via the pure water to etch the semiconductor substrate.

Further, the third aspect of the present invention provides a method of manufacturing a semiconductor substrate, which comprises the steps of: dipping polycrystal silicon particles in an acid aqueous solution; irradiating ultraviolet rays upon the polycrystal silicon particles dipped in the acid aqueous solution to reduce metallic impurities contained in the polycrystal silicon.

In the first aspect of the present invention, since the semiconductor substrate is etched during the irradiation of ultraviolet rays upon the semiconductor substrate and in contact with an F-containing aqueous solution, the oxide film and the semiconductor substrate can be etched at an equivalent speed simultaneously under excellent controllability, without deteriorating the planarization of the substrate.

In the second aspect of the present invention, since the semiconductor wafer is etched during the irradiation of ultraviolet rays upon the semiconductor wafer under exposure to an acid aqueous solution, it is possible to remove metallic contamination and particles adhering onto the wafer surface, without deteriorating the surface roughness. Further, since the elements dissolved into the acid aqueous solution used for the etching is analyzed, it is possible to analyze the impurity elements in the outermost layer of the semiconductor wafer at high precision on.

In the third aspect of the present invention, since electrons in the metal contained in the polycrystal silicon are supplied to holes generated by the irradiation of ultraviolet rays upon the semiconductor wafer for recombination, and further since the electrons flow out into the aqueous solution as ions, it is possible to reduce the metallic impurities in the monocrystal silicon wafer, as compared with the conventional one.

BRIEF DESCRIPTION OF THE DRAWINGS

FIGS. 15(A) and 15(B) are graphical representations showing the surface roughness measurement results of the sample shown in FIG. 13 by use of an AFM (atomic force microscope);

DETAILED DESCRIPTION OF THE EMBODIMENTS (First aspect of the invention)

The gist of the first aspect of the present invention can be summarized as follows: In the process of etching the already existing oxide film at the element region (after the process of forming the field oxide film in accordance with LOCO method to separate the element region but before the process of forming the gate oxide film), the thinning of the gate oxide film is prevented by applying an F-containing aqueous solution onto the substrate or dipping the substrate therein and further by irradiating ultraviolet rays upon the substrate under the above-mentioned conditions.

A first method of the first aspect of the present invention will be described hereinbelow with reference to FIGS. 1 to 3.

Figure 1:
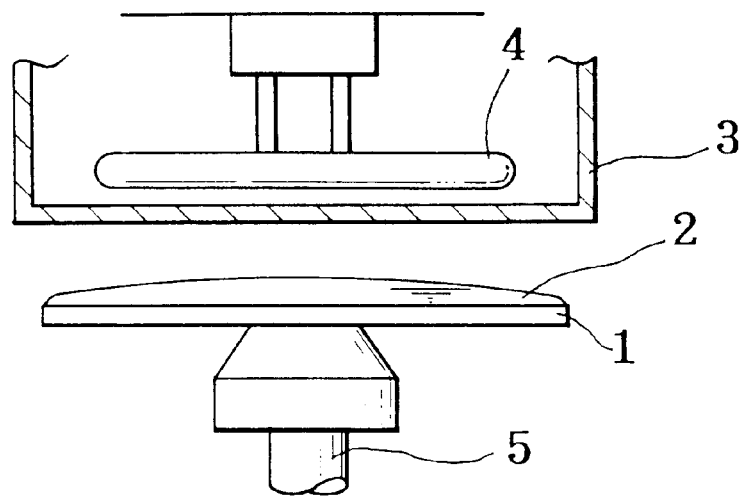
FIG. 1 is a longitudinal cross-sectional view showing an instrument used for the first aspect according to the present invention.

FIG. 1 is a side view showing an ultraviolet ray processing instrument used for the present invention. This instrument includes a substrate supporting stage 5 for supporting a Si substrate 1 onto the surface of which an aqueous solution 2 is applied. At a position opposing to the Si substrate 1, an ultraviolet ray lamp 4 is provided through a sapphire lamp cover 3.

Figure 2A:
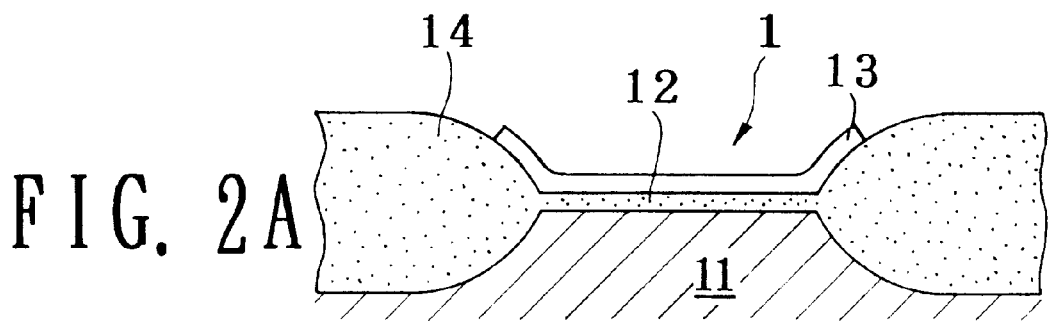
FIGS. 2(A) to 2(D) are cross-sectional views for assistance in explaining the process of forming the field oxide film of the first aspect according to the present invention.
Figure 2B:
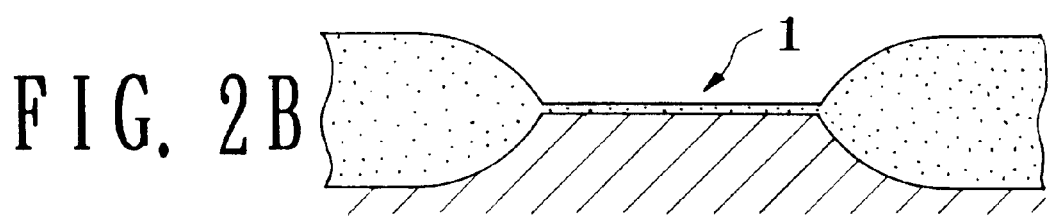
Figure 2C:
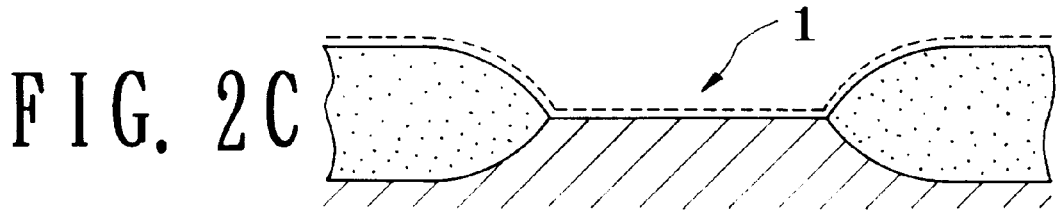
Figure 2D:
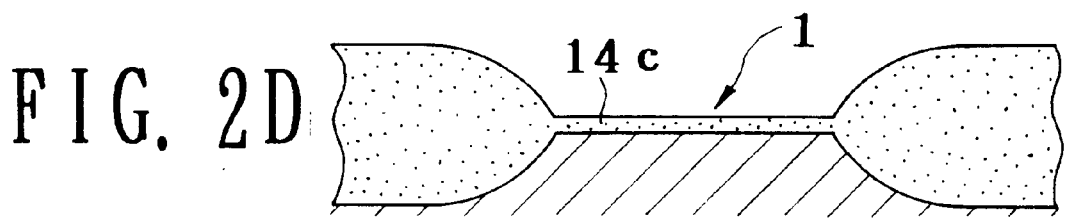

By use of this ultraviolet ray processing instrument, a MOS capacitor was manufactured in accordance with the process as shown in FIGS. 2(A) to 2(D), which are the same as that shown in FIGS. 4(A) to 4(D) except the process shown by 4(C). That is, the Si substrate 1 obtained by the step as shown in FIG. 2(B) is processed by the step as shown in FIG. 2(C) by use of the instrument as shown in FIG. 1, so that the Si substrate as shown in FIG. 2(D) can be obtained. In more detail, in the Si substrate 1 as shown in FIG. 2(B), two thick field oxide film portions 14 are formed on both sides of the element region and further a thin pad oxide film 12 is formed between the two thick field oxide film portions 14. The Si substrate 1 as shown in FIG. 2(B) is processed to remove the outermost surface portions of the field oxide film 14 and the pad oxide film 12, with the result that the substrate 1 processed as shown in FIG. 2(C) can be obtained. In more detail, the process shown in FIG. 2(C) are effected as follows: First, the substrate 1 is put on the instrument as shown in FIG. 1, and then the instrument is kept within an oxygen atmosphere. After that, the substrate 1 is irradiated with ultraviolet rays, and further 0.05-HF (hydrofluoric acid aqueous solution) 2 is applied onto the substrate 1. The 0.05%-HF 2 with a thickness of about 2 to 4 mm is applied uniformly on the surface of the substrate 1 by a surface tension thereof. Under these conditions, the substrate 1 is kept for about 10 min, with the result that the pad oxide film 11 and the field oxide film 14 are both etched by this 0.05%-HF 2. In this case, after the pad oxide film 12 has been etched off perfectly, the exposed Si substrate 1 (under the pad oxide film 12) is etched at roughly the same etching speed as that of the oxide film due to the synergistic effect of both the 0.05%-HF 2 and the ultraviolet rays.

Figure 4A:
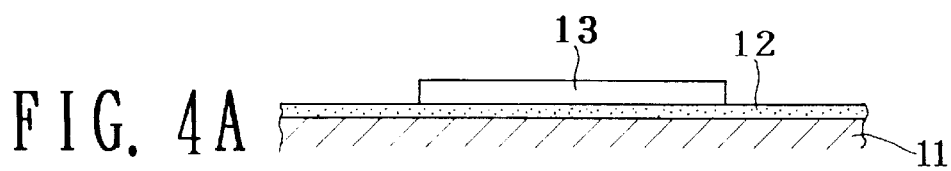
FIGS. 4(A) to 4(D) are the cross-sectional views for assistance in explaining the prior art process of forming the field oxide film.
Figure 4B:
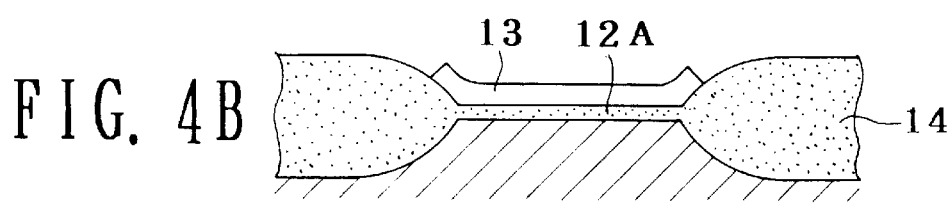
Figure 4C:
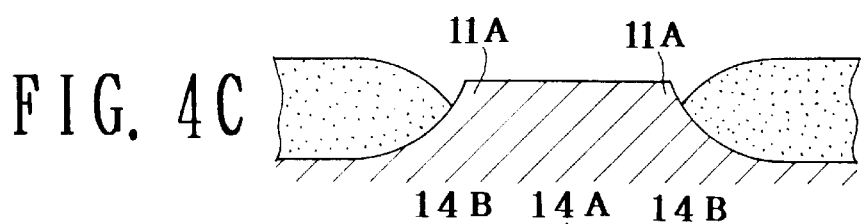
Figure 4D:
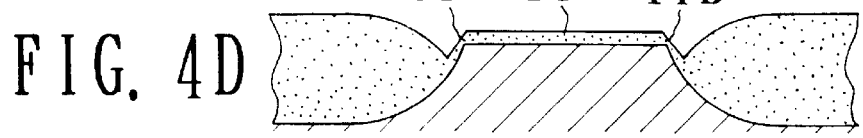

After the above-mentioned processing, the Si substrate 1 is washed within the same instrument and then carried out. In the Si substrate 1 manufactured as described above, there exists no corner portions 11A as shown in FIG. 4(C) at the interface between the field oxide film 14 and the surface of the exposed Si substrate 1; that is, the substrate 1 is formed into the flat shape as shown in FIG. 4(C). As a result, after that, even if the gate oxide film 14C is formed, since no corner portions 11A are present, the oxide film 14C will not be thinned as shown in FIG. 4(D).

The insulation breakdown positions of the gate oxide film of the MOS capacitor manufactured as described above were measured, and compared with those of the MOS capacitor manufactured in accordance with the prior art method.

Figure 3A:
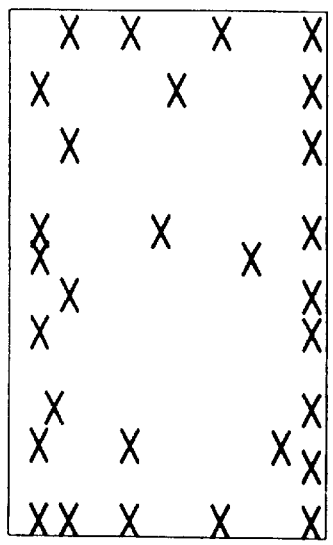
FIGS. 3(A) and 3(B) are comparative maps showing statistical break-down positions of the oxide film obtained after the insulating breakdown measurement of a MOS capacitor, in which (A) shows the case o f the prior art and (B) shows the case of the first aspect according to the present invention.
Figure 3B:
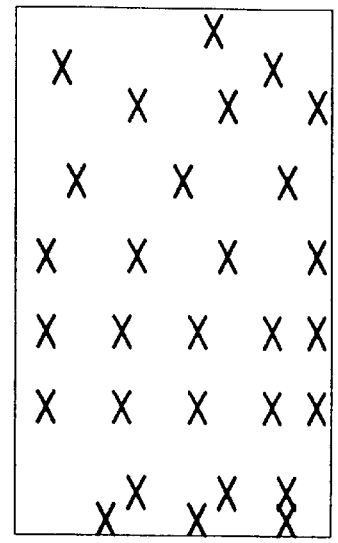

FIGS. 3(A) and 3(B) show the measured results, in which (A) represents the insulation breakdown positions of the prior art MOS capacitor and (B) represents the same positions of the invention MOS capacitor. In the case of the prior art MOS capacitor (A), the breakdown positions of the oxide film concentrate at the edge portions of the oxide film as shown by marks X. On the other hand, in the case of the invention MOS capacitor (B), the breakdown positions of the oxide film distribute roughly uniformly all over the surface of the oxide film also as shown by marks X. Further, the breakdown voltage at which breakdown occurs of the invention MOS capacitor was higher than that of the prior art MOS capacitor. This may be due to the fact that the thinning portions (which would otherwise be produced in the prior art method) are not produced at the edge portions of the invention gate oxide film. Further, this is because when the substrate is etched by use of the HF aqueous solution and the ultraviolet rays in combination, since the etching speed of the oxide film can be roughly equalized to that of the Si substrate, the selection ratio of both (oxide film and silicon) by etching can be reduced to that extent.

Further, in the processing by the above-mentioned instrument, a low-pressure mercury-arc lamp having an output of 80 mW/cm$^2$ was used as the ultraviolet ray lamp 4. The lamp 4 was placed being spaced 2 cm away from the Si substrate 1. The reason why the atmosphere within the instrument was replaced with oxygen is as follows: when the planarization rate at the element region was measured after etching process by irradiation of ultraviolet rays, the planarization rate in oxygen atmosphere was excellent as compared with that in argon atmosphere. However, even in the argon atmosphere, the similar etching effect can be obtained.

In the process as described above, it seems that the etching of the Si substrate 1 may result not from the ozonization of oxygen existing in the aqueous solution due to the ultraviolet rays, but from the anode solution of Si caused by carriers produced by light excitation to silicon. As a result, it is preferable to use a light source whose power is as high as possible. As the aqueous solution 2 applied onto the substrate 1, a solution which can etch the silicon oxide film must be used. However, it is preferable that the etching speed of silicon oxide film is roughly equal to that of silicon under the irradiation of ultraviolet rays, as listed in Table 1 below. Accordingly, in this method, 0.05% hydrofluoric acid aqueous solution was used as the chemical. Without being limited thereto, however, it is also possible to use hydrofluoric ammonium aqueous solution or fluorosilicic acid. In this case, when the pH or the concentration thereof are adjusted appropriately, it is possible to obtain the same effect as with the case of the hydrofluoric acid aqueous solution.

TABLE 1

(Etching speed of Si and SiO$_2$)

| HF CONC OF LIQUID | Si | SiO$_2$ | RATIO (Si/SiO$_2$) |
|---|---|---|---|
| 0.05% HF | 0.3 nm/min | 0.2 nm/min | 1.5 |
| 0.5% HF | 1.0 nm/min | 5.0 nm/min | 0.2 |

As a matter of course, various methods of applying the chemical upon the substrate under irradiation of ultraviolet rays can be adopted such that: the substrate is dipped in a shallow vessel; the liquid is kept applied under irradiation of ultraviolet rays; the substrate is kept rotated; etc.

Further, as the means for etching SiO$_2$ (silicon oxide film) and Si (substrate) under irradiation of ultraviolet rays, the method of using hydrofluoric nitric acid (a mixed aqueous solution of HF and HNO$_3$) can be adopted. In the case where the hydrofluoric nitric acid is used, the inventor's experiments indicated that the planarization rate deteriorated and the controllability of etching also deteriorated. In contrast with this, in the case of the method of using the HF and the ultraviolet rays according to the present invention as described above, the etching of at least the silicon can be controlled sufficiently by turning on/off the light source of the ultraviolet rays or by shading the light source thereof. In addition, the non-uniformity of etching can be suppressed by rotating the substrate.

In the first aspect of the present invention, since the substrate is irradiated with ultraviolet rays in contact with the F-containing aqueous solution such as hydrofluoric acid (in the same way as with the case of the prior art method), it is possible to etch the oxide film and the substrate at equivalent etching speed under excellent controllability, with the result that the oxide film can be etched without deteriorating the planarization of the silicon substrate. Therefore, when the method according to the present invention is applied after the elements have been separated in accordance with the LOCOS method but immediately before the gate oxide film is formed (as preprocessing), it is possible to prevent the edge portions from being formed at the field oxide film due to overetching of the filed oxide film, and thereby to suppress the gate oxide film from being thinned thereat.

(Second aspect of the present invention)

The gist of the second aspect can be summarized as follows: An acid aqueous solution is applied onto the semiconductor wafer; and ultraviolet rays are irradiated upon the semiconductor wafer under these conditions to etch the semiconductor wafer. Further, metallic impurities on the outermost surface of the semiconductor wafer are analyzed by analyzing the acid aqueous solution used for the above-mentioned etching processing.

The second aspect will be described hereinbelow with reference to FIGS. 5 to 18. Further, the first method of this second aspect will be described hereinbelow with reference to FIGS. 9 to 14.

Figure 10:
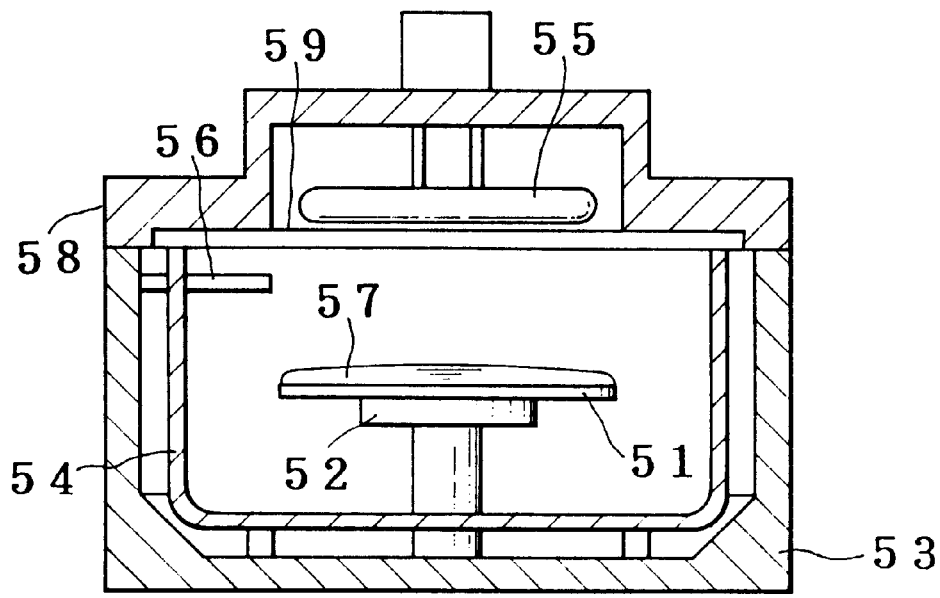
FIG. 10 is a longitudinal cross-sectional view showing a first example of an instrument used for the second aspect according to the present invention.

An instrument used for the analysis evaluation is shown in FIG. 10. In the drawing, the instrument includes a vessel-shaped instrument casing 53 opening upward. Within this casing 53 an inner chamber 54 is provided under floating condition. Further, within this inner chamber 54, a wafer stage 102 for rotatably supporting a semiconductor wafer 51 is provided. Further, a nozzle 56 is provided on the upper portion of the inner wall of the inner chamber 54. A chemical and pure (demineralized) water are selectively jetted onto the wafer 51 through this nozzle 56. Therefore, the chemical 57 jetted through the nozzle 56 is mounted on the surface of the wafer 51 as shown in FIG. 10. Further, the casing 53 is covered by an upper lid 58. On the lower surface of the upper lid 58, a sapphire window 59 is formed, in which a low-pressure mercury lamp 55 is attached being hung down from the upper lid 58.

In more detail, the semiconductor wafer 51 is fixed onto the stage 52 which is rotatable and movable in the vertical direction, so as to be opposed to the low-pressure mercury lamp 55 through the sapphire window 59. The casing 53 is formed of PTFE, and the inner chamber 54 is formed of quartz. The inner chamber 54 is placed in the casing 53 so as to form an airtight space between the inner chamber 54 and the sapphire window 59. A chemical or pure water is jetted onto the semiconductor wafer 51 through the fixed chemical/pure water jet nozzle 56 via a switching valve (not shown). The chemical or pure water jetted onto the semiconductor wafer 51 can be kept as it is on the surface of the semiconductor wafer 51 by the surface tension thereof, as shown by 57 in FIG. 10. Further, the atmosphere components of the chamber of the instrument can be adjusted to any desired components by a rough evacuation with a vacuum pump and by a supply of gas into the chamber.

Figure 9:
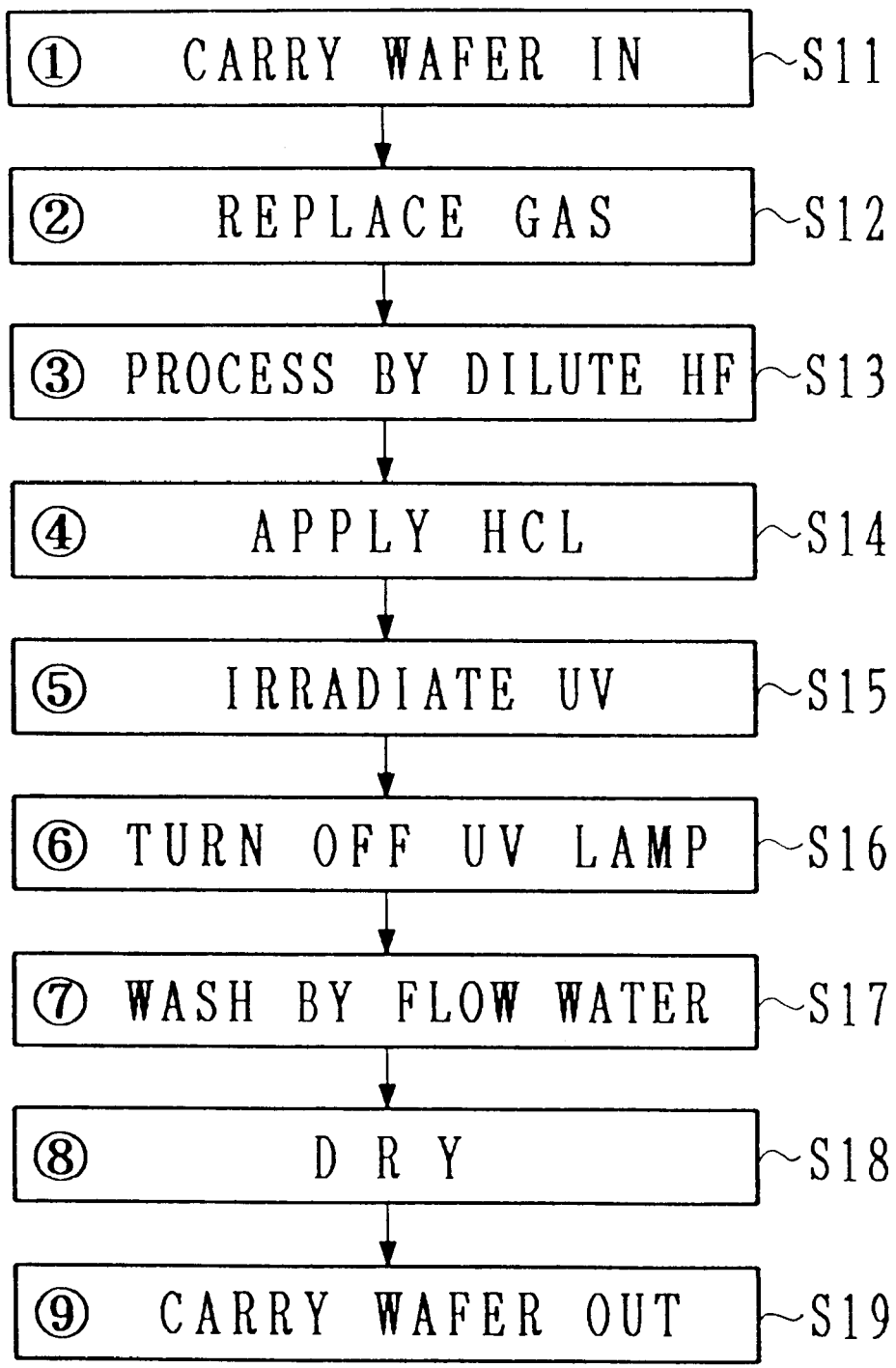
FIG. 9 is a process sequence diagram showing a first processing (wafer processing) of the second aspect according to the present invention.
Figure 16:
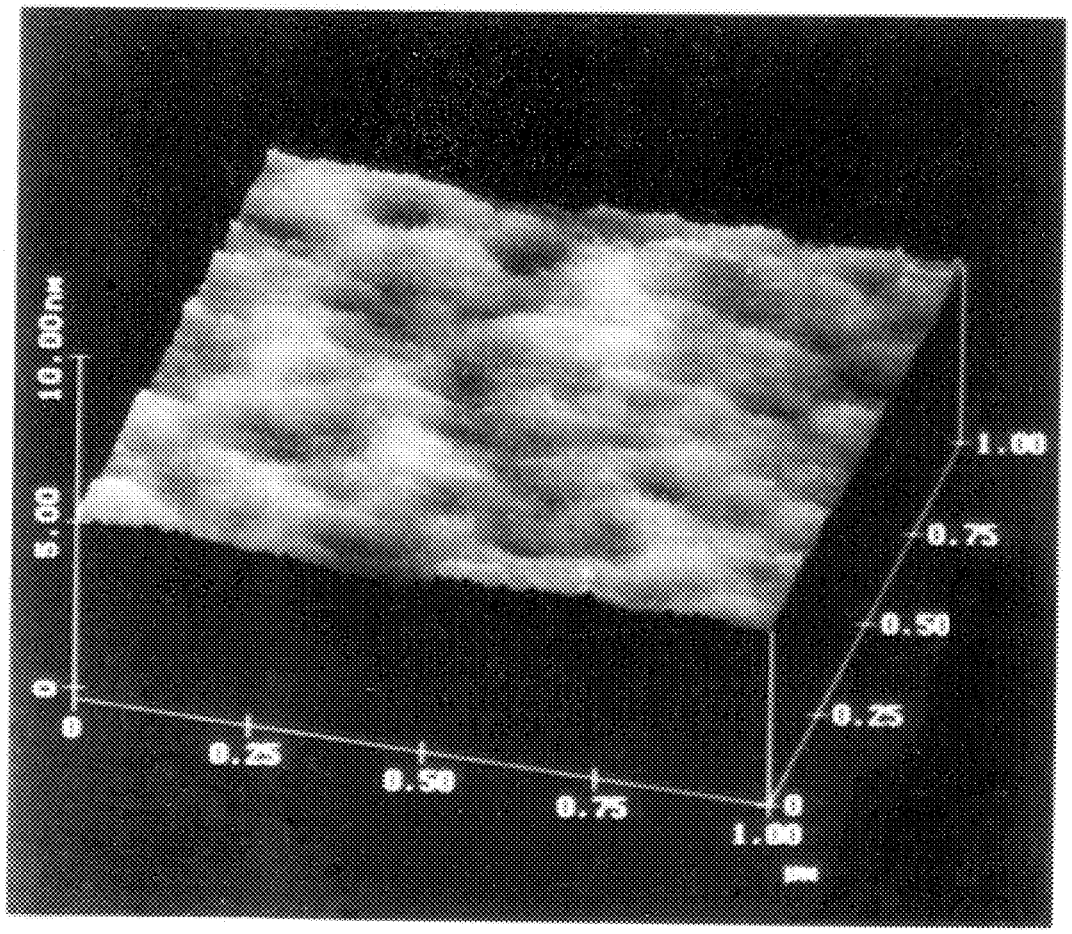
FIG. 16 is a microscope photograph showing the surface of a sample obtained by use of the AFM, which can be obtained by converting detected electric signals into an image in the same way as with the case of an electron microscope, and in which the roughness of a wafer processed in $O_2$ is shown in substitution for a graphical representation.

In experiments, the semiconductor wafer 51 patterned by use of an oxide film was processed in accordance with a sequence as shown in FIG. 9. In more detail, after the wafer 51 had been carried into the chamber (in step S11), the gas within the chamber was replaced with Ar gas (in step S12). After that, the natural oxide film formed on the exposed portion of the Si was removed by use of 0.5% (dilute) HF (in step S13), and then the wafer 51 was once dried. After that, 35% HCL (hydrochloric acid) is applied onto the wafer 51 (in step S14), and ultraviolet rays were irradiated upon the wafer 51 for 30 min (in step S15). As a result, as shown in FIGS. 15(A) and (B), a difference in height level of about 15 nm depth was observed. These graphs indicate that the oxide film was hardly etched off during the above-mentioned process. Further, FIGS. 15(A) and (B) indicate that the roughness is equivalent between before and after etching. In particular, when the chamber atmosphere was $O_2$, the roughness was excellent comparatively, as shown in FIG. 16.

Figure 17:
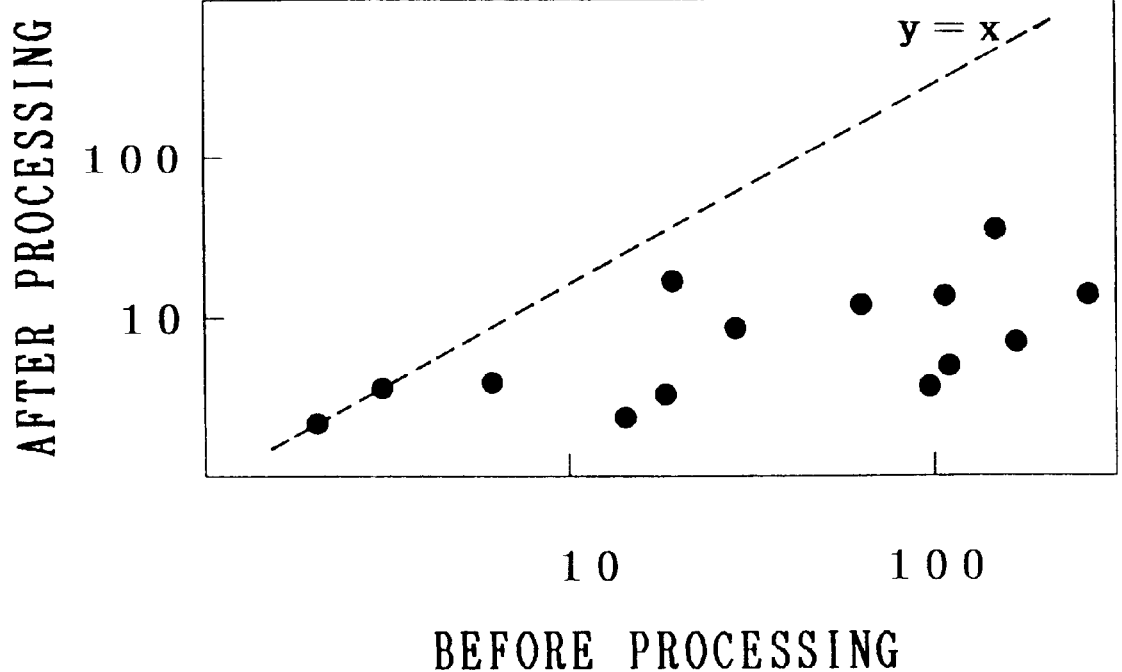
FIG. 17 is a graphical representation showing the particle removal capability.

In the case of the wafer processed at high temperature (e.g., epitaxial wafer or hydrogen annealed wafer, in particular), an oxide film will not exist on the surface thereof. Therefore, it has been known that metal is deposited on the surface of the wafer when a chemical is applied thereonto. In other words, metallic impurities of high concentration exist in the vicinity of the surface as a device active layer. In the case of the semiconductor wafer as described above, the processing of the third aspect of the present invention (described later) is effective; that is, it is possible to remove and wash off an impurity layer segregated at a high concentration, without deteriorating the planarization. Further, the third aspect is effective to remove particles, as shown in FIG. 17.

In the case of etching by use of HCL, the etching effect was hardly expected by use of 7% HCL. Therefore, when the selective etching between the oxide film and bare silicon is not severe, it is preferable to use HF.

Further, 0.5% HF or 0.05% HF (instead of HCL) was applied onto the above-mentioned patterned sample in step S14 of FIG. 9, for comparison. In other words, the semiconductor wafer 51 carried in step S11 was processed as with the case of FIG. 9 by use of HF instead of HCL. In this comparative processing, the processing (3) (in step S13 shown in FIG. 9) is unnecessary. When etched by applying 0.5% HF, an oxide film pattern of a thickness of 100 nm was perfectly etched off by the irradiation processing of the ultraviolet rays for 20 min. In the case of a thicker oxide film, therefore, it is effective to use the 0.5% HF from the standpoint of etching speed. In the case where 0.05% HF was applied, a thick oxide film was left without being etched off. Further, even if the HF concentration is reduced half, since the etching rate is about a half, it is possible to improve the etching selectivity between the oxide film and silicon.

As a matter of course, in the case of the wafer having no pattern of oxide film, when a higher concentration HF is applied onto the wafer and the ultraviolet rays are irradiated thereupon, a higher etching speed can be obtained. Further, the particles adhering onto the wafer surface can be removed from the wafer surface through the lift-off processing. As a result, it was observed that the number of particles adhering on the wafer surface was reduced. The processed wafer represents hydrophobic property, so that the wafer surface is in such a state that particles adhere easily thereonto. However, when the wafer is processed by the pure water application and ultraviolet ray irradiation or ozone oxidation, continuously after the HF application and the ultraviolet ray irradiation, it is possible to suppress the adhering of particles onto the wafer surface, as well as metallic impurities.

In this connection, in the above-mentioned method, the low-pressure mercury lamp 55 was a vortex lamp having a diameter of 150 mm and an output of 80 mW/cm$^2$. However, when the light source of a higher output or a shorter wavelength is used, the etching speed can be further increased.

Figure 11:
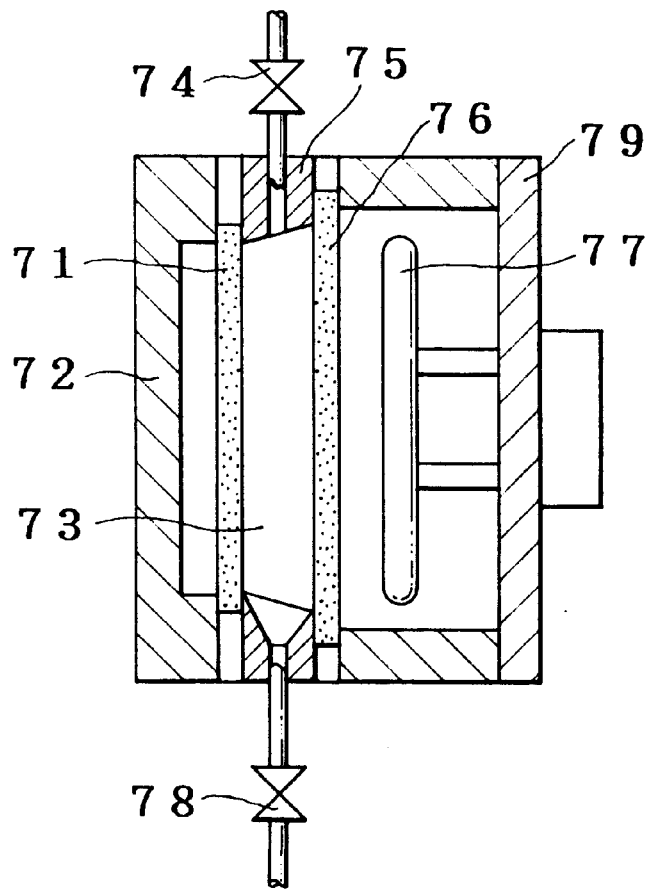
FIG. 11 is a longitudinal cross-sectional view showing a second example of an instrument used for the second aspect (wafer analysis) according to the present invention.

FIG. 11 shows an instrument for analyzing the metallic impurities on the surface of the wafer processed as described above. In FIG. 11, the instrument has a pair of casings 72 and 75 for fixedly pinching the semiconductor wafer 71. To the casing 75, another casing 79 is attached via a sapphire window 76. The inside of this casing 79 can be replaced with $N_2$ or Ar gas. A low-pressure mercury lamp 77 is airtightly disposed within this casing 79. A chemical and pure water can be selectively supplied to a space 73 formed between the semiconductor wafer 71 and the sapphire window 79 within the casing 75 so that the space 73 can be filled therewith. The chemical or pure water in this space 73 can be drained to the outside through a drainage valve 78.

Figure 12:
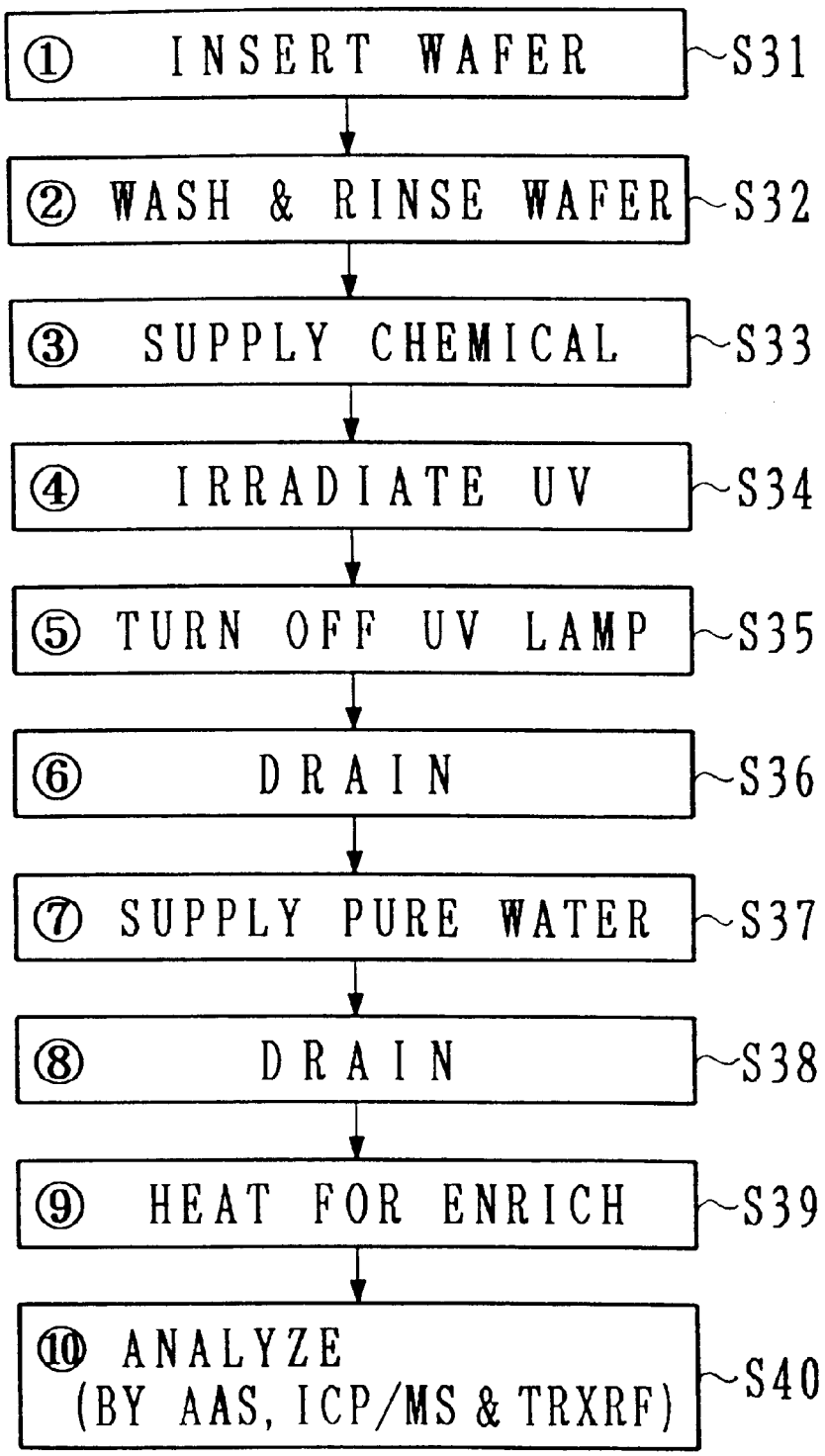
FIG. 12 is a sequence diagram showing a second processing (wafer analysis) of the second aspect according to the present invention.
Figure 13:
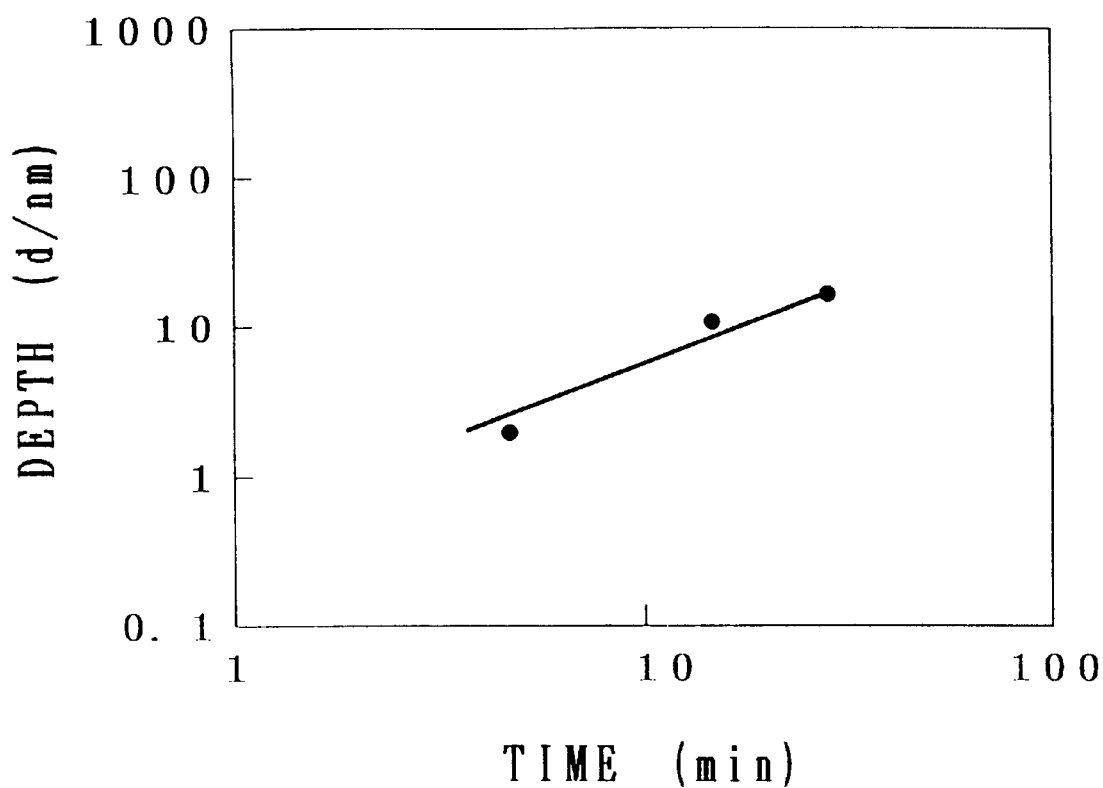
FIG. 13 is a first-sample graphical representation showing the change in etching depth with respect to the ultraviolet ray processing time when 35% HCL is applied.
Figure 14:
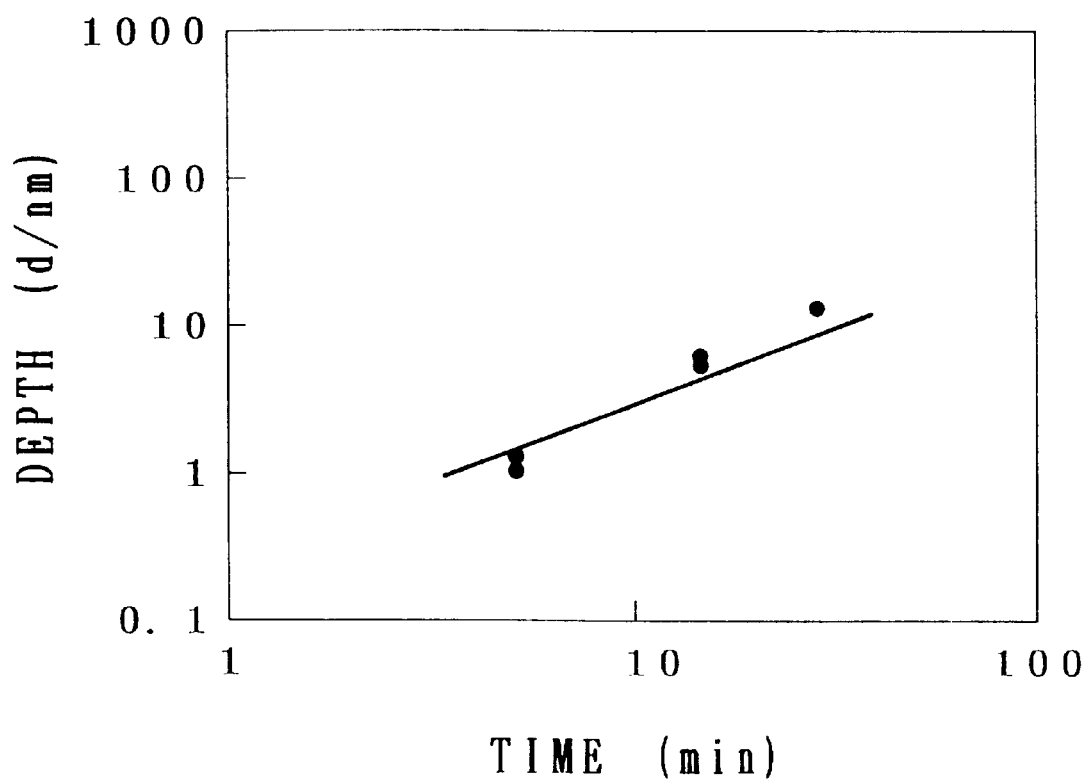
FIG. 14 is a second-sample graphical representation showing the change in etching depth with respect to the ultraviolet ray processing time when 35% HCL is applied.

In the instrument constructed as described above, the wafer was processed in accordance with the sequence as shown in FIG. 12. As already explained with respect to the prior art method, when the wafer was etched on the basis of chemical reaction by use of hydrofluoric nitric acid based chemical, the etching non-uniformity was produced on the wafer surface due to time lag of supply and/or drain of the chemical. In contrast with this, in the present method, since the etching time can be adjusted by turning on or off the ultraviolet ray lamp, the non-uniformity of etching was not produced. Further, in order to remove metallic impurities and particles adhering onto the wafer surface before etching, it is preferable to wash the wafer by the ultraviolet ray processing in a chemical in a short time or by use of the prior art chemical (dilute HF processing in step S13 shown in FIG. 9).

The following process may also be applied:

As SOI (silicon on insulator) wafer is used as the semiconductor wafer 51 or 71. An Si layer in the SOI wafer is etched with HCl, and then an oxide layer under the Si layer is etched with HF.

In more detail, the SOI wafer has the Si substrate (base), the oxide layer (intermediate layer) and the Si layer (surface layer). HCl is applied onto the Si layer which is irradiated with ultraviolet rays. The Si layer is etched with HCl under irradiation with ultraviolet rays (first etching process). Waste liquid after etching is recovered and analyzed.

Then, HF is applied onto the oxide layer for etching (second etching process). Waste liquid from the second etching process is recovered and analyzed.

The oxide layer is not etched with HCl in the first etching process, but is etched only with the HF in the second etching process.

In the above-mentioned method, although HCL and HF were used as the chemicals, since the chemicals are supplied into the airtight space 73, the amount of chemical to be supplied thereinto is small, respectively. Further, since an excellent etching effect can be obtained by use of a diluted chemical (e.g., 0.05% HF), the etching is not susceptible to change of the purity of the chemical itself.

Further, in the case where electrodes are provided in order to apply a voltage across the semiconductor wafer through the chemical put within the space 73 during the ultraviolet ray irradiation, it is possible to further improve the etching speed.

Figure 18:
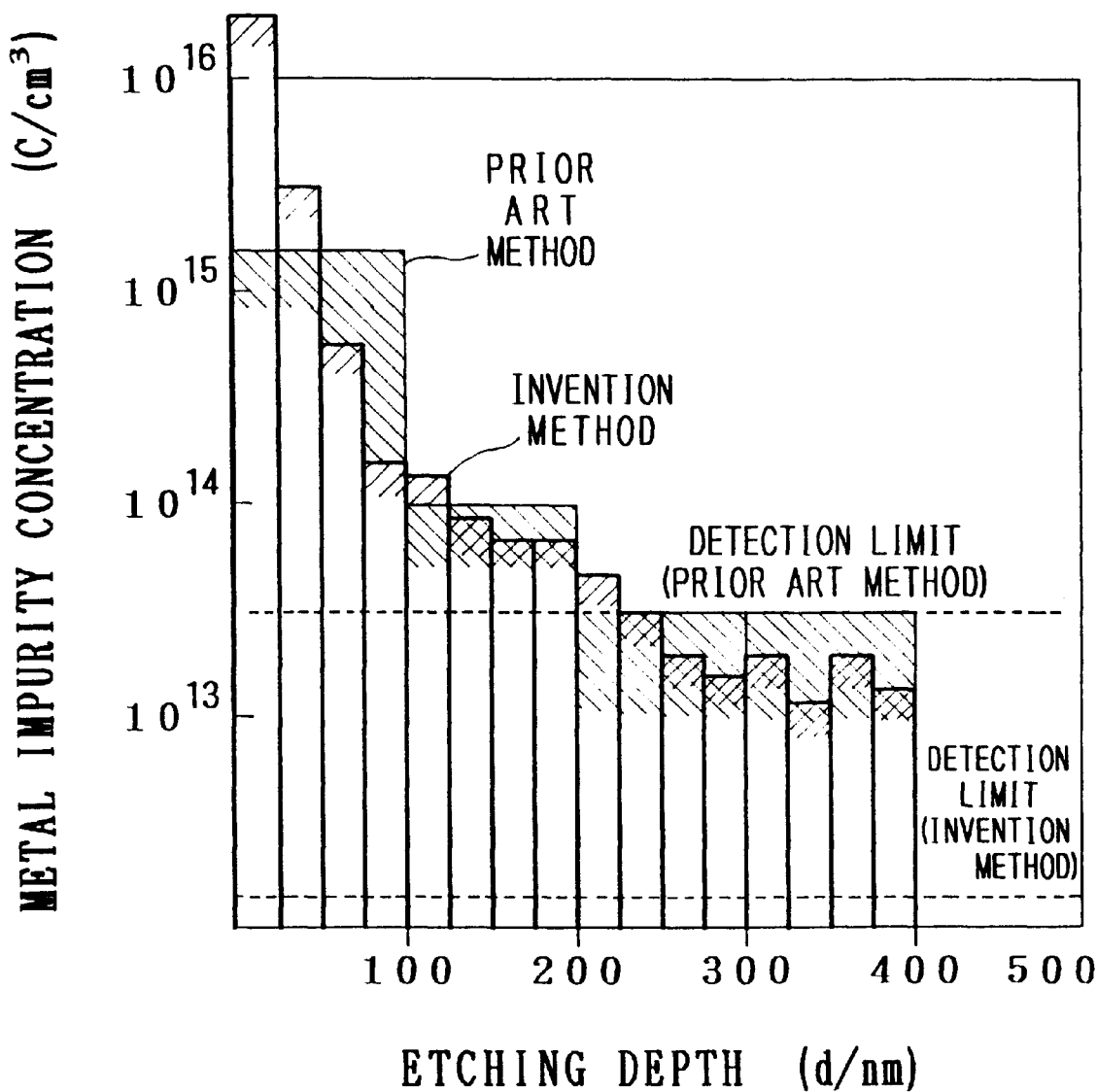
FIG. 18 is a graphical representation showing the comparative examples of analyses of the surface layers between the prior art method and the invention method.

Here, the chemicals used for the above-mentioned etching processing can be analyzed quantitatively or qualitatively in accordance with AAS (atomic absorption spectroscopy) or ICP-MS (induction coupled plasma-mass spectroscopy), after the chemicals have been shifted into a teflon beaker for heating and enrichment. As a matter of course, when a small amount of chemical is used for etching, the enrichment is not necessary, and heating is also unnecessary for enrichment. Further, the chemical can be enriched by dropping the chemicals on the wafer of hydrophobic property (such as processed by diluted HF) for evaporation and thereby for dry solidification. In the case of the prior art etchent, since the wafer is dissolved during evaporation and dry solidification of the etchent, a specific processing has been required. In the present method, however, since the sample obtained by evaporation, dry and solidification on the wafer surface can be analyzed as it is in accordance with total reflection X-ray fluorescence analysis (TRXRF), the etching chemical can be easily and directly analyzed qualitatively and quantitatively at a high sensitivity. FIG. 18 shows the metallic impurity concentrations obtained in accordance with the prior art analyzing method and the invention analyzing method for comparison. In the case of the analyzing method according to the present invention, the resolving power can be improved in particular on the outermost surface layer of the semiconductor wafer. In addition, since the invention method is not susceptible to change in the purity of the chemical itself, a high sensitive analysis can be attained in the method according to the present invention.

The etching mechanism of silicon by use of the ultraviolet rays and the acid aqueous solution as described above may be due to the reaction between silicon and negative ions (anions) (existing in the acid aqueous solution and excited by ultraviolet rays) and a contribution of the carriers in the silicon (excited by the ultraviolet ray irradiation) to the above-mentioned reaction. Pure water will not be decomposed by the ultraviolet rays (>184.9 nm) emitted from the low-pressure mercury lamp. The chemicals used for the processing of the present method were HCL and HF. However, since the etching performance of oxidizing acid such as $H_2O_2$ or $HNO_3$ is not high, when $H_2O_2$ or $HNO_3$ is added to the HCL and HF, for instance, the silicon etching reaction other that the photochemical reaction occurs, with the result that the addition thereof to HCL and HF is not preferable because the etching controllability deteriorates. On the other hand, however, it is apparent that the similar etching effect can be expected, as far as the non-oxidizing acid other than HCL and HF is used.

According to the present method as described above, since the semiconductor wafer is etched being irradiated with ultraviolet rays under the condition that the wafer is dipped in an acid aqueous solution or the acid aqueous solution is applied onto the wafer, it is possible to remove both metallic contamination and particles both adhering onto the wafer surface at the same time, without deteriorating the surface roughness of the wafer. In the prior art method, both the metallic contamination and particles can be removed simultaneously only when two or more washing methods are combined with each other. Further, in the method according to the present invention, it is possible to analyze the impurity elements existing in the outermost surface layer of the semiconductor wafer at a high precision, by enriching and further analyzing the acid aqueous solution used for etching, as occasion demands.

Further, in the case where a large amount of etching as with the above-mentioned case is not required, the following method can be applied.

This method can be summarized as follows: after the oxide film formed on the surface of the semiconductor substrate has been removed by use of a fluorine-containing aqueous solution or a fluorine-containing gas, pure water is continuously supplied onto the surface of the semiconductor substrate. Further, the substrate is irradiated with ultraviolet rays via the pure water applied on the surface of the semiconductor substrate.

Figure 5:
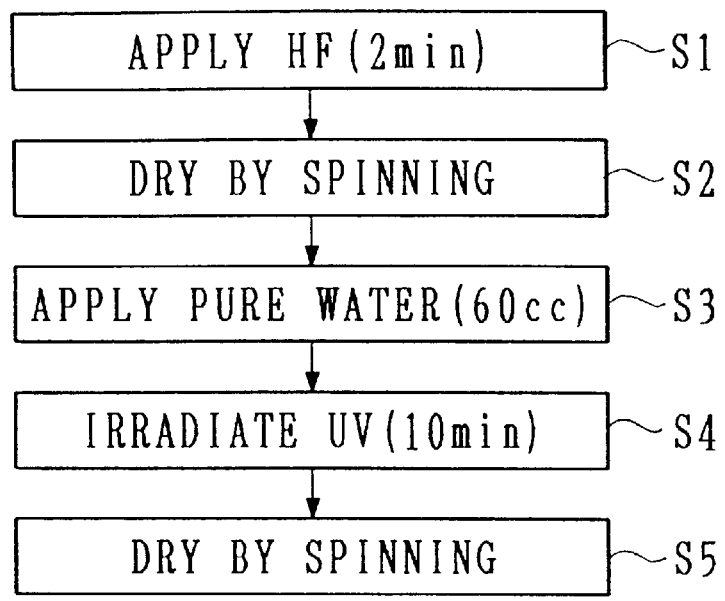
FIG. 5 is a flowchart for assistance in explaining a second aspect according to the present invention.
Figure 6:
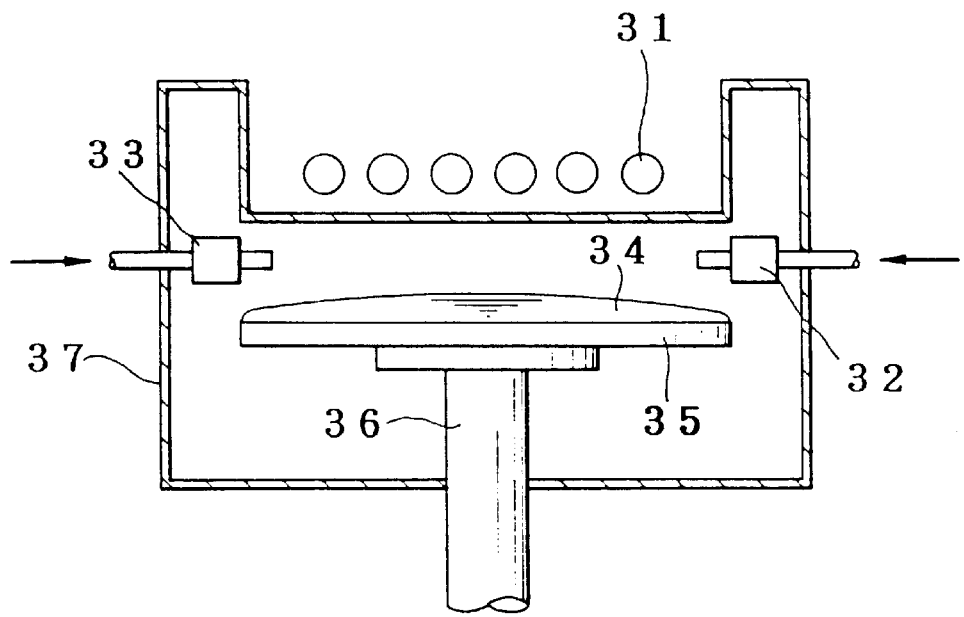
FIG. 6 is a longitudinal cross-sectional view showing an instrument used for the second aspect according to the present invention.
Figure 7:
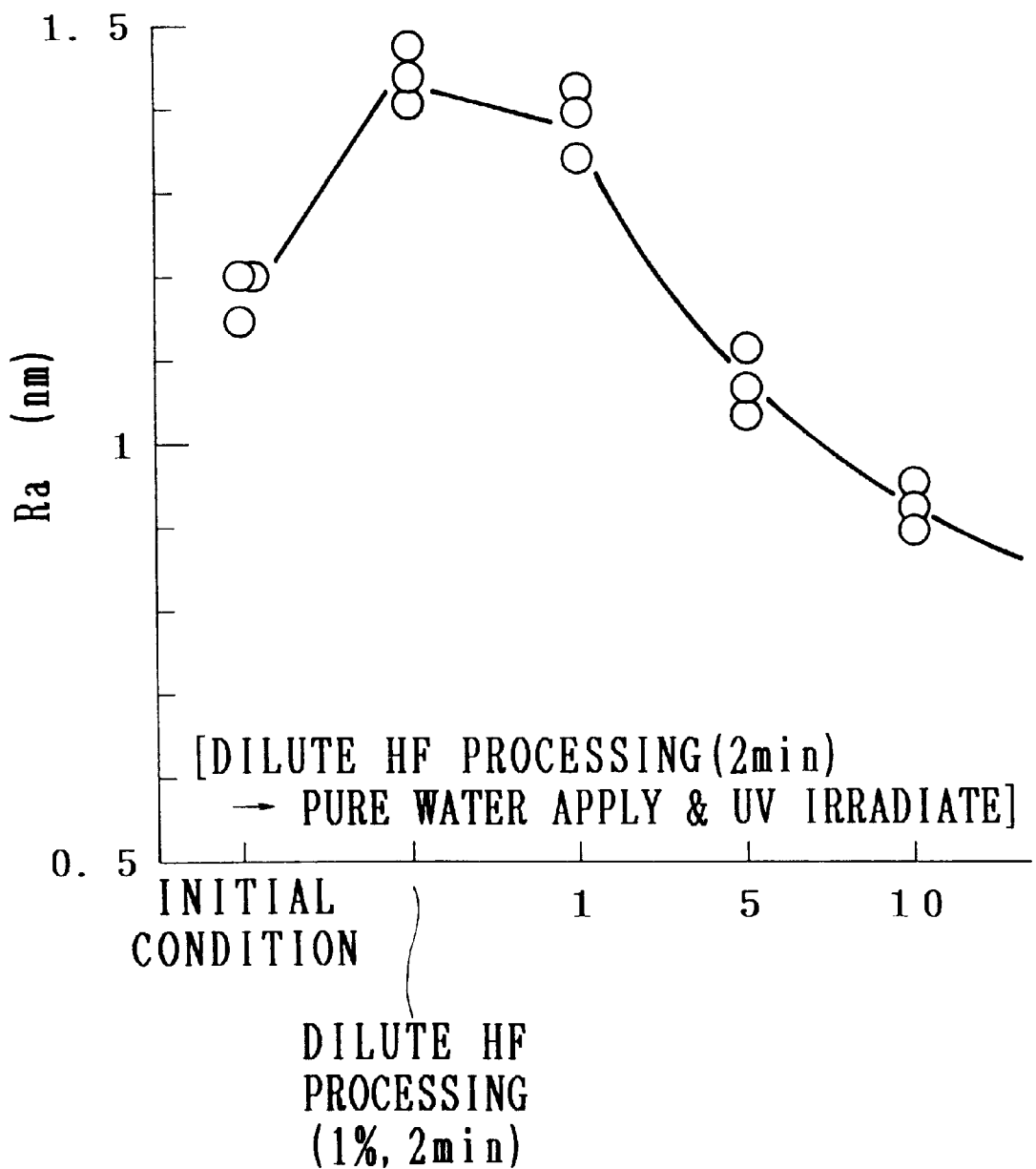
FIG. 7 is a graphical representation showing the roughness (Ra) with respect to the processing time of ultraviolet rays in the second aspect of the present invention.
Figure 8:
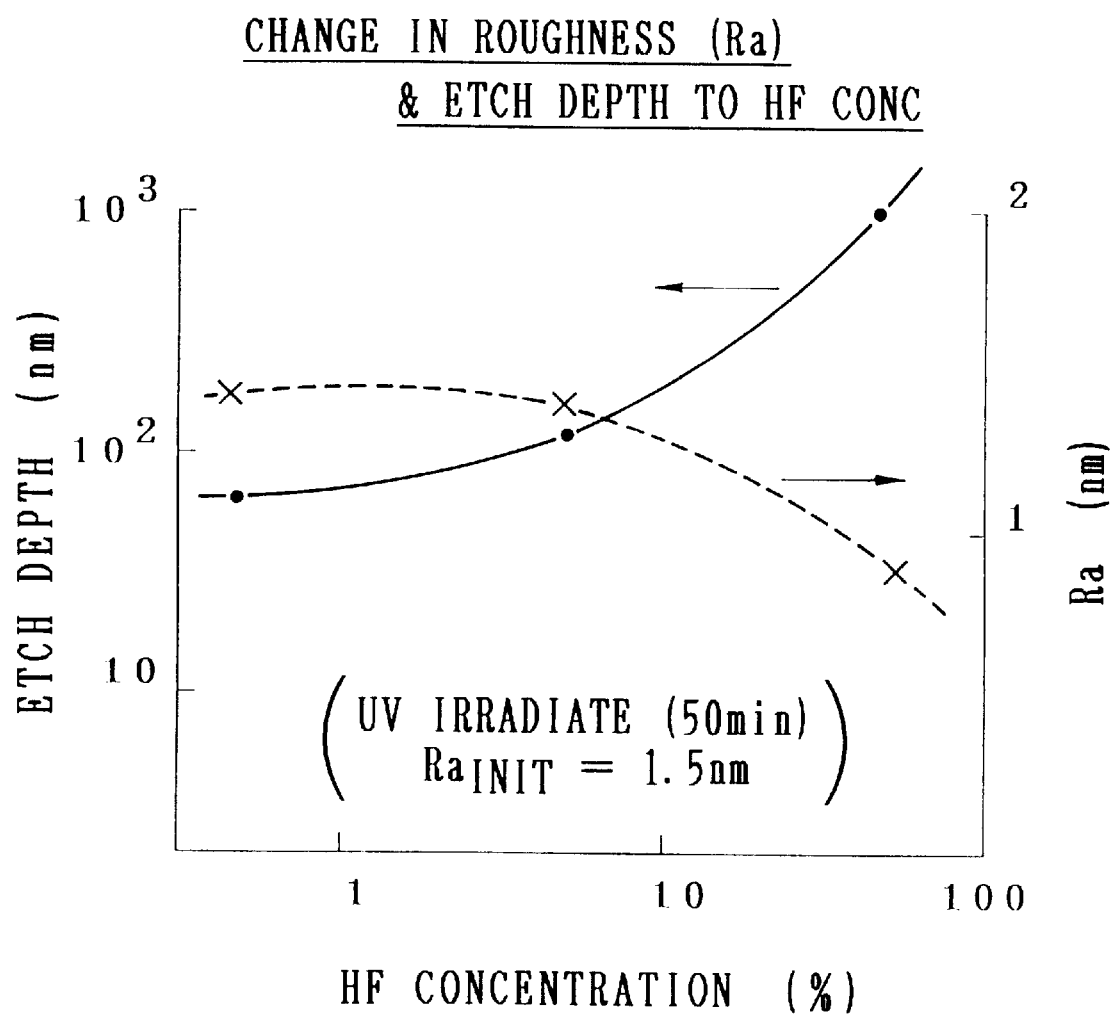
FIG. 8 is a graphical representation showing the etching depth and the roughness (Ra) with respect to the HF concentration.

This method will be described in further detail hereinbelow with reference to FIGS. 5 to 8. FIG. 5 is a flowchart showing the sequence of this method; FIG. 6 is an instrument used for this method; FIG. 7 shows the change in the roughness (Ra) according to the irradiation time of the ultraviolet rays; and FIG. 8 shows the dependencies of changes in etching depth and the roughness (Ra) upon the HF concentration (%).

In the instrument as shown in FIG. 6, a stage 36 for rotatably supporting a semiconductor substrate 35 having pure water 34 on the surface thereof is provided in an airtight chamber 37. Into the chamber 37, chemical and pure water can be supplied through a chemical supply nozzle 32 and a pure water supply nozzle 33 provided on both side surfaces of the chamber 37, respectively. Further, a low-pressure mercury lamp (80 mW/cm$^2$) is disposed within the chamber 37 so as to be opposed to the substrate 35.

The semiconductor substrate was etched by use of the instrument as shown in FIG. 6 and in accordance with the sequence as shown in FIG. 5.

Onto the surface of the silicon semiconductor substrate (referred to as Si wafer, hereinafter) with a diameter of 150 mm and fixed on the stage 36, 0.5% hydrofluoric acid (HF) is applied through the nozzle 32 to etch the natural oxide film formed on the surface of the Si wafer 35 (in step S1). After that, the stage 36 is rotated to remove the HF by a centrifugal force generated by the rotating stage 36 (in step S2). Further, pure water is applied onto the Si wafer 35 through the nozzle 33 at a flow rate of 0.21 l/min (in step S3). In this case, pure water with a thickness of about 2 to 4 mm is applied on the Si wafer 35 by a surface tension thereof. Further, in the case of the Si wafer with a diameter of 150 mm, about 55 cc pure water can be applied onto the surface of the Si wafer. In this case, however, the pure water supply time was controlled so that pure water of 60 cc was applied thereon under consideration of the non-uniformities of pure water supply and application. Further, in this case, it was confirmed that the etching speed was reduced when the amount of pure water to be supplied was large.

Under the condition that the pure water was supplied onto the Si wafer 35, the ultraviolet rays were irradiated upon the Si wafer for 10 min (in step S4). After that, the stage 36 was rotated to remove the pure water from the Si wafer (spin dry) (in step S5).

As a result of the above-mentioned processing, about 8 nm etching was recognized. Further, the surface roughness was suppressed below that obtained before the processing. Further, a Si wafer (on which a thermal oxide film with a thickness of 100 nm was patterned) was used to check the etching depth. The oxide film was left without being etched, after the processing of 12 min (inclusive of the HF application process of 2 min).

It was known that etching rate changes according to the irradiation time of the ultraviolet rays (as shown in FIG. 7) and the HF concentration (%) (as shown in FIG. 8). In the case where the ultraviolet rays were irradiated after the natural oxide film had been etched by the 0.05% HF and further the wafer had been washed by flowing water for about 10 min, the etching rate was reduced down to ⅓. This indicates that the etching is related to F adhering onto the Si, because F is easily removed by washing. Further, the reason why the etching speed is reduced when the amount of pure water to be supplied increases may be due to the fact that the replacement of Si—F bonding with Si—OH bonding can be promoted by the supply of new pure water.

When the Si wafer is etched in the method as described above, it is possible to selectively etch the surface of the Si wafer 35 with the oxide film as a mask, while maintaining the planarization and the initial conditions.

Further, in the above-mentioned method, although nothing is particularly described of the processing atmosphere, a more preferable result was obtained with respect to the etching rate and the roughness in an $O_2$ atmosphere, as compared with an inert gas (Ar or $N_2$) atmosphere.

Further, in the above description, the Si wafer was preprocessed by use of 0.5% HF aqueous solution as the HF application (2 min) in step S1 of FIG. 5. However, when 49% HF aqueous solution was used, the etching speed was increases and further the roughness was improved as shown in FIG. 8. Further, the same excellent results were obtained when $NH^4F$ was used instead of HF.

Further, the natural oxide film of the Si wafer can be removed by use of HF vapor, instead of HF liquid. In this case, pure water is preferably applied to the surface of the Si wafer, before the pattern of the thermal oxide film has been perfectly etched off. In the method as described above, if the thickness of the thermal oxide film is 100 nm, a sufficient selectivity can be obtained. Further, since a high concentration F adheres onto the surface on which the natural oxide film has been resolved, it is possible to realize a high speed Si etching (as shown in FIG. 8).

Further, there exists such a case that it is required to prevent particles from adhering onto the surface of the wafer after the processing, by changing the wafer surface to a hydrophilic surface. In such case, after a predetermined time irradiation of the ultraviolet rays, the ultraviolet ray processing is further kept continued by supplying pure water, so that it is possible to obtain a hydrophilic wafer surface, without exposing the hydrophobic wafer surface to air. In addition, it is of course possible to remove organic substances from the wafer surface during the ultraviolet ray irradiation.

Further, the Si wafers were evaluated with respect to the oxide film breakdown and TDDB. As a result, an improvement of the non-defective ratio was confirmed, with respect to the samples processed as described above immediately before the gate oxidation.

As described above, in the method according to the present invention, after the preprocessing by HF, since the Si wafer is irradiated with the ultraviolet rays by continuously applying pure water thereonto, Si etching proceeds only on the silicon surface onto which F adheres, so that the Si wafer can be selectively etched according to the presence or absence of the oxide film, while improving the surface roughness. In addition, metallic impurities can be removed simultaneously.

(Third aspect of the present invention)

The third aspect can be summarized as follows: polycrystal silicon pulverized into particles is dipped in water or an acid aqueous solution, and the Si wafer is irradiated with the ultraviolet rays by agitating the liquid to reduce metallic impurities in the polycrystal silicon.

The principle of this third aspect is as follows: when the wafer is irradiated with ultraviolet rays, pairs of electron and hole are produced in poly silicon. In this case, metals in the polycrystal silicon supply electrons to holes for recombination. The fact that metal emits electrons implies that the metal itself is oxidized, so that the metal is dissolved to water or acid aqueous solution as ions. Ions dissolved in the acid aqueous solution are not easily reabsorbed by polycrystal silicon.

The method of the third aspect according to the present invention will be described hereinbelow.

Figure 19:
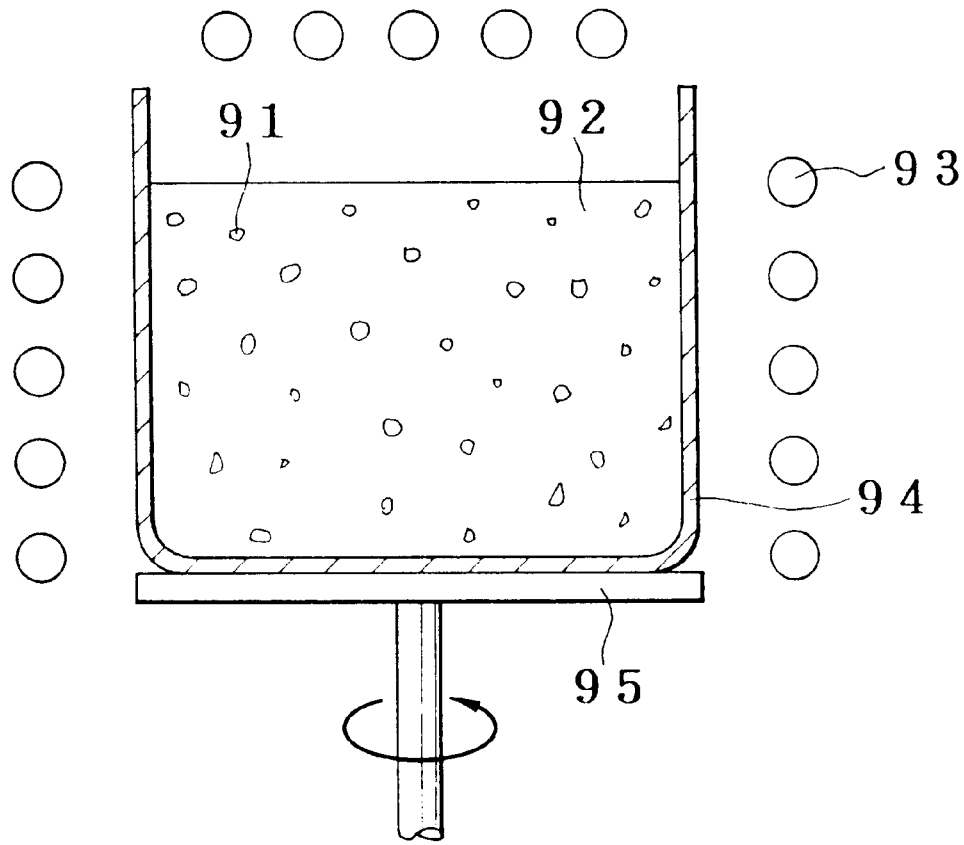
FIG. 19 is a partial cross-sectional view showing an example of the instrument used for a third aspect according to the present invention.

FIG. 19 shows an instrument used for the third aspect of the present invention. The instrument includes a tank 94 for putting polycrystal silicon 91 and aqueous solution 92, a rotatable base 95 for mounting the tank 94, and an ultraviolet ray lamps 93 arranged around the tank 94.

The polycrystal silicon put into the tank 94 becomes more effective as the diameter of the particles is decreased, because the surface areas thereof increases. In this method, the polycrystal silicon is pulverized into particles whose diameter is less than 5 mm. The pulverized polycrystal silicon 91 of 5 kg is put into the quartz tank 94 together with 1% acid aqueous solution 93 of 20 kg. The polycrystal silicon 91 is irradiated with the ultraviolet ray lamp 93 by rotating the rotatable base 95 at a speed of 60 r.p.m. The wavelengths of the low-pressure mercury ultraviolet ray lamps 93 have major peaks at 185.4 mm and 253.7 mm, respectively. Ten ultraviolet ray lamps 93 are arranged in total around and over the tank 94. The output of each lamp is 300 W. Under these conditions, the polycrystal silicon 91 is processed for 30 min. After that, the acid aqueous solution 92 is drained. Further, the polycrystal silicon 91 is rinsed by pure water and further dried by drying nitrogen. The polycrystal silicon 91 thus processes is used as a raw material for growing a monocrystal silicon.

Figure 20:
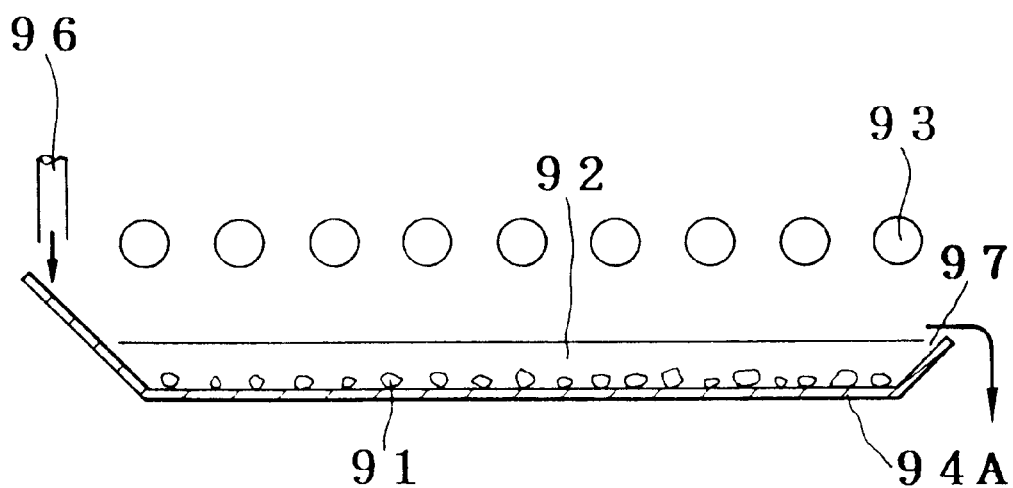
FIG. 20 is a partial cross-sectional view showing another example of the instrument used for the third aspect according to the present invention.

The second method of the third aspect according to the present invention will be described hereinbelow. FIG. 20 shows an instrument used for the second method thereof. This instrument is characterized in that a liquid supply nozzle 96 for supplying a liquid and a drain port 97 are provided in a shallow tank 94A. Further, pure water and 0.5% acid aqueous solution can be supplied through the supply nozzle 96, separately. In the same way as with the case of the first method, the polycrystal silicon 91 is put in the tank 94A as uniformly as possible. Further, 0.5% acid aqueous solution is first supplied for 3 min. After that, pure water is supplied for 10 min. In the sequence, the polycrystal silicon 91 is kept irradiated with the ultraviolet rays. After the above-mentioned sequence is repeated three times, the liquid supply is stopped and the polycrystal silicon 91 is dried by drying nitrogen. The polycrystal silicon 91 thus processes is used as a raw material for growing a monocrystal silicon.

By use of the third aspect of the present invention, it is possible to reduce metallic impurities in the polycrystal silicon. As a result, metallic impurities in a monocrystal silicon wafer manufactured by using the invention polycrystal silicon as raw material can be reduced as listed in Table 2 below, in comparison with those in a monocrystal silicon wafer manufactured by using the prior art polycrystal silicon.

TABLE 2

|  | Fe | Al |
| --- | --- | --- |
| INVENTION | $3 \times 10^{10}$ atoms/cm$^3$ | $5 \times 10^{11}$ atoms/cm$^3$ |
| PRIOR ART | $4 \times 10^{4}$ atoms/cm$^3$ | $8 \times 10^{10}$ atoms/cm$^3$ |

Table 2 indicates that there exists an effect of reducing metallic impurities in the semiconductor wafer in accordance with the method of the third aspect of the present invention.

As described above, according to the first aspect of the present invention, since the oxide film and the semiconductor substrate can be etched at almost an equivalent etching speed, when this method is applied after the elements have been separated in accordance with the LOCOS method but before the gate oxide film is formed, it is possible to prevent the gate oxide film from being thinned.

According to the second aspect of the present invention, it is possible to remove metallic contamination and particles from the surface of the semiconductor wafer in a single process, without deteriorating the surface roughness of the semiconductor wafer.

According to the third aspect of the present invention, since impurities in the polycrystal silicon are dissolved into an aqueous solution as ions, the impurities of the silicon monocrystal wafer manufactured by use of the polycrystal silicon as a raw material can be reduced.

What is claimed is:

1. A method of processing a semiconductor substrate, which comprises:
   a first step of exposing a semiconductor wafer in an acid aqueous solution; and
   a second step of irradiating ultraviolet rays upon the semiconductor wafer exposed in the acid aqueous solution, to etch the semiconductor wafer wherein said wafer comprises silicon.

2. The method of processing a semiconductor substrate of claim 1, which further comprises a step of, before the first step, removing a natural oxide film formed on a silicon-exposure portion by use of hydrofluoric acid in an argon atmosphere; and in the first step, any one of hydrochloric acid, hydrofluoric acid and a mixture of both is used as the acid aqueous solution.

3. A method of analyzing a semiconductor substrate, which comprises:
   a first step of exposing a semiconductor wafer in an acid aqueous solution;
   a second step of irradiating ultraviolet rays upon the semiconductor wafer exposed in the acid aqueous solution, to etch the semiconductor wafer; and
   a third step of analyzing the acid aqueous solution obtained after the etch, to analyze impurities existing on the outermost surface layer of the semiconductor wafer wherein said wafer comprises silicon.

4. The method of analyzing a semiconductor substrate of claim 3, wherein the semiconductor wafer is a silicon on insulator wafer.

5. The method of analyzing a semiconductor substrate of claim 3, which further comprises a step of, before the first step, removing a natural oxide film formed on a silicon-exposure portion by use of hydrofluoric acid in an argon atmosphere; wherein the acid aqueous solution is selected from the group consisting of hydrochloric acid, hydrofluoric acid, and mixtures thereof.

6. A method of processing a semiconductor substrate, which comprises:
   a first step of removing an oxide film formed on a surface of the semiconductor substrate (35) by an aqueous solution or gas containing fluorine;
   a second step of supplying pure water on a surface of the semiconductor substrate (35); and
   a third step of irradiating ultraviolet rays upon the surface of the semiconductor substrate (35) via the pure water to etch the semiconductor substrate wherein said wafer comprises silicon.

7. The method of processing a semiconductor substrate of claim 6, wherein in the first step, a 0.5% hydrogen fluoride is applied on the surface of the semiconductor substrate (35); and in the second step, pure water is applied on the surface of the semiconductor substrate.

8. The method of processing a semiconductor substrate of claim 6, wherein in the third step, the ultraviolet rays are irradiated for about 10 min.

9. The method of processing a semiconductor substrate of claim 7, wherein in the third step, the ultraviolet rays are irradiated for about 10 min.

10. The method of processing a semiconductor substrate of claim 6, wherein in the first step, $NH_4F$ is used.

11. The method of processing a semiconductor substrate of claim 6, wherein the etching is effected in any one of oxygen atmosphere and inert gas atmosphere.

12. A method of manufacturing a semiconductor substrate, which comprises the steps of:

dipping polycrystal silicon particles in an acid aqueous solution; and irradiating ultraviolet rays upon the polycrystal silicon particles dipped in the acid aqueous solution to reduce metallic impurities contained in the polycrystal silicon.

13. The method of manufacturing a semiconductor substrate of claim 12, wherein any one of water and hydrofluoric acid aqueous solution is used as the acid aqueous solution, and a low-pressure mercury lamp is used as the ultraviolet ray lamp.

14. The method of manufacturing a semiconductor substrate of claim 12, wherein the acid aqueous solution and the polycrystal silicon particles are both rotated under irradiation of the ultraviolet rays thereupon.

15. The method of manufacturing a semiconductor substrate of claim 12, wherein the polycrystal silicon particles are dipped into the acid aqueous solution and pure water alternately several times under irradiation of the ultraviolet rays.

16. A method for etching silicon, comprising:

irradiating said silicon with ultraviolet rays while said silicon is in contact with water or an aqueous solution.

17. The method of claim 16, wherein said silicon is a semiconductor wafer.

18. The method of claim 17, further comprising, before said irradiating, removing a natural oxide film from said silicon.

19. The method of claim 17, wherein said silicon is in contact with an aqueous solution of hydrochloric acid, hydrofluoric acid or a mixture thereof.

20. The method of claim 17, wherein said irradiating takes place in a chamber containing an atmosphere comprising oxygen gas.

21. The method of claim 17, wherein said silicon is polycyrstal silicon particles.

22. The method of claim 21, wherein said silicon is in contact with said water or an aqueous solution of hydrofluoric acid.

23. The method of claim 21, wherein during said irradiating, said polycyrstal silicon particles are dipped into said water and said aqueous solution, alternately, several times.

* * * * *